United States Patent
Yu et al.

(10) Patent No.: US 12,243,681 B2
(45) Date of Patent: Mar. 4, 2025

(54) PROGRAMMABLE INDUCTOR AND METHODS OF MANUFACTURE

(71) Applicant: Taiwan Semiconductor Manufacturing Co., Ltd., Hsinchu (TW)

(72) Inventors: Chen-Hua Yu, Hsinchu (TW); Mirng-Ji Lii, Sinpu Township (TW); Hao-Yi Tsai, Hsinchu (TW); Hsien-Wei Chen, Hsinchu (TW); Hung-Yi Kuo, Taipei (TW); Nien-Fang Wu, Chiayi (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

(21) Appl. No.: 18/360,571

(22) Filed: Jul. 27, 2023

(65) Prior Publication Data

US 2023/0368972 A1    Nov. 16, 2023

Related U.S. Application Data

(60) Division of application No. 16/390,784, filed on Apr. 22, 2019, now Pat. No. 11,756,731, which is a continuation of application No. 13/832,964, filed on Mar. 15, 2013, now Pat. No. 10,269,489.

(51) Int. Cl.
| | |
|---|---|
| *H01F 41/04* | (2006.01) |
| *H01F 17/00* | (2006.01) |
| *H01L 23/522* | (2006.01) |
| *H01L 23/525* | (2006.01) |

(52) U.S. Cl.
CPC ....... *H01F 41/045* (2013.01); *H01F 17/0006* (2013.01); *H01F 41/042* (2013.01); *H01L 23/5227* (2013.01); *H01L 23/5256* (2013.01); *H01F 2017/0046* (2013.01); *Y10T 29/4902* (2015.01)

(58) Field of Classification Search
CPC .. H01F 41/045; H01F 17/0006; H01F 41/042; H01F 2017/0046; H01L 23/5227; H01L 23/5256; Y10T 29/4902
See application file for complete search history.

(56) References Cited

U.S. PATENT DOCUMENTS

| | | | |
|---|---|---|---|
| 4,021,705 A | 5/1977 | Lichtblau | |
| 5,015,972 A | 5/1991 | Cygan et al. | |
| 5,293,096 A | 3/1994 | Nakamura | |
| 5,370,766 A * | 12/1994 | Desaigoudar | ....... H01L 23/5227 430/296 |
| 5,629,553 A | 5/1997 | Ikeda et al. | |
| 6,437,651 B2 | 8/2002 | Chigira et al. | |
| 6,480,086 B1 * | 11/2002 | Kluge | ................. H01F 17/0013 336/200 |
| 6,480,110 B2 | 11/2002 | Lee et al. | |

(Continued)

*Primary Examiner* — S M Sohel Imtiaz
(74) *Attorney, Agent, or Firm* — Slater Matsil, LLP

(57) ABSTRACT

A system and method for providing and programming a programmable inductor is provided. The structure of the programmable inductor includes multiple turns, with programmable interconnects incorporated at various points around the turns to provide a desired isolation of the turns during programming. In an embodiment the programming may be controlled using the size of the vias, the number of vias, or the shapes of the interconnects.

20 Claims, 8 Drawing Sheets

(56) References Cited

U.S. PATENT DOCUMENTS

| | | |
|---|---|---|
| 6,492,707 B1 | 12/2002 | Kaku et al. |
| 6,867,474 B2 | 3/2005 | Noire et al. |
| 6,975,199 B2 | 12/2005 | Long et al. |
| 6,992,366 B2 | 1/2006 | Kim et al. |
| 7,067,359 B2 | 6/2006 | Wu |
| 7,183,625 B2 | 2/2007 | Hsieh |
| 7,227,240 B2 | 6/2007 | Knapp et al. |
| 7,298,238 B1 | 11/2007 | Eaton et al. |
| 7,339,696 B2 | 3/2008 | Ferlitsch |
| 7,348,654 B2 | 3/2008 | Hsieh et al. |
| 7,456,722 B1 | 11/2008 | Eaton et al. |
| 7,847,666 B2 * | 12/2010 | Moinian ............ H01F 17/0006 336/200 |
| 7,875,955 B1 * | 1/2011 | Hopper ................. H01F 17/02 336/200 |
| 8,009,006 B2 | 8/2011 | Ahn et al. |
| 8,054,153 B2 | 11/2011 | Jeon et al. |
| 8,193,781 B2 | 6/2012 | Lin et al. |
| 8,432,049 B2 | 4/2013 | Jung |
| 8,522,812 B2 | 9/2013 | Rocheleau |
| 9,543,068 B2 | 1/2017 | Aboush et al. |
| 9,548,158 B2 | 1/2017 | Groves et al. |
| 9,866,287 B2 | 1/2018 | Stadelmeier et al. |
| 2001/0050597 A1 | 12/2001 | Chigira et al. |
| 2002/0097153 A1 | 7/2002 | Youbok et al. |
| 2005/0221539 A1 | 10/2005 | Kim et al. |
| 2006/0006494 A1 | 1/2006 | Wu |
| 2006/0022300 A1 | 2/2006 | Wu et al. |
| 2006/0139138 A1 | 6/2006 | Watanabe et al. |
| 2007/0069717 A1 * | 3/2007 | Cheung ............... H03F 3/45475 324/750.26 |
| 2008/0006882 A1 * | 1/2008 | Huang ................... H01L 28/10 257/379 |
| 2008/0042239 A1 | 2/2008 | Lin |
| 2008/0074229 A1 * | 3/2008 | Moinian ............ H01F 17/0006 336/200 |
| 2008/0296697 A1 | 12/2008 | Hsu et al. |
| 2009/0091025 A1 * | 4/2009 | Wong ................. H01L 25/0657 156/247 |
| 2009/0174014 A1 | 7/2009 | Kunze et al. |
| 2012/0154073 A1 | 6/2012 | Lee et al. |
| 2012/0223796 A1 | 9/2012 | Huang et al. |
| 2012/0306048 A1 | 12/2012 | Li et al. |
| 2013/0193584 A1 * | 8/2013 | Ding .................. H01L 23/481 257/774 |
| 2014/0061643 A1 | 3/2014 | Kaeriyama |
| 2015/0102890 A1 * | 4/2015 | Nakamura ......... H01F 27/2804 336/200 |

\* cited by examiner

PROGRAMMABLE INDUCTOR AND METHODS OF MANUFACTURE

PRIORITY CLAIM AND CROSS-REFERENCE

This application is a divisional of U.S. patent application Ser. No. 16/390,784, filed Apr. 22, 2019, entitled "Programmable Inductor," which is a continuation of U.S. patent application Ser. No. 13/832,964, filed Mar. 15, 2013, entitled "Programmable Inductor," now U.S. Pat. No. 10,269,489 issued on Apr. 23, 2019, which applications are hereby incorporated herein by reference.

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Inductors may be utilized in a wide variety of applications. For example, inductors may be manufactured and used in mobile devices to receive and filter incoming signals which may then be passed on for further processing. However, because mobile devices may be used in different locations, and these different locations may have different parameters (e.g., frequency bands) used to communicate, the inductors are generally designed for use in a particular geographic region.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the embodiments provides many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a programmable inductor for use in semiconductor devices. The embodiments may also be applied, however, to other inductors.

Figure 1A:
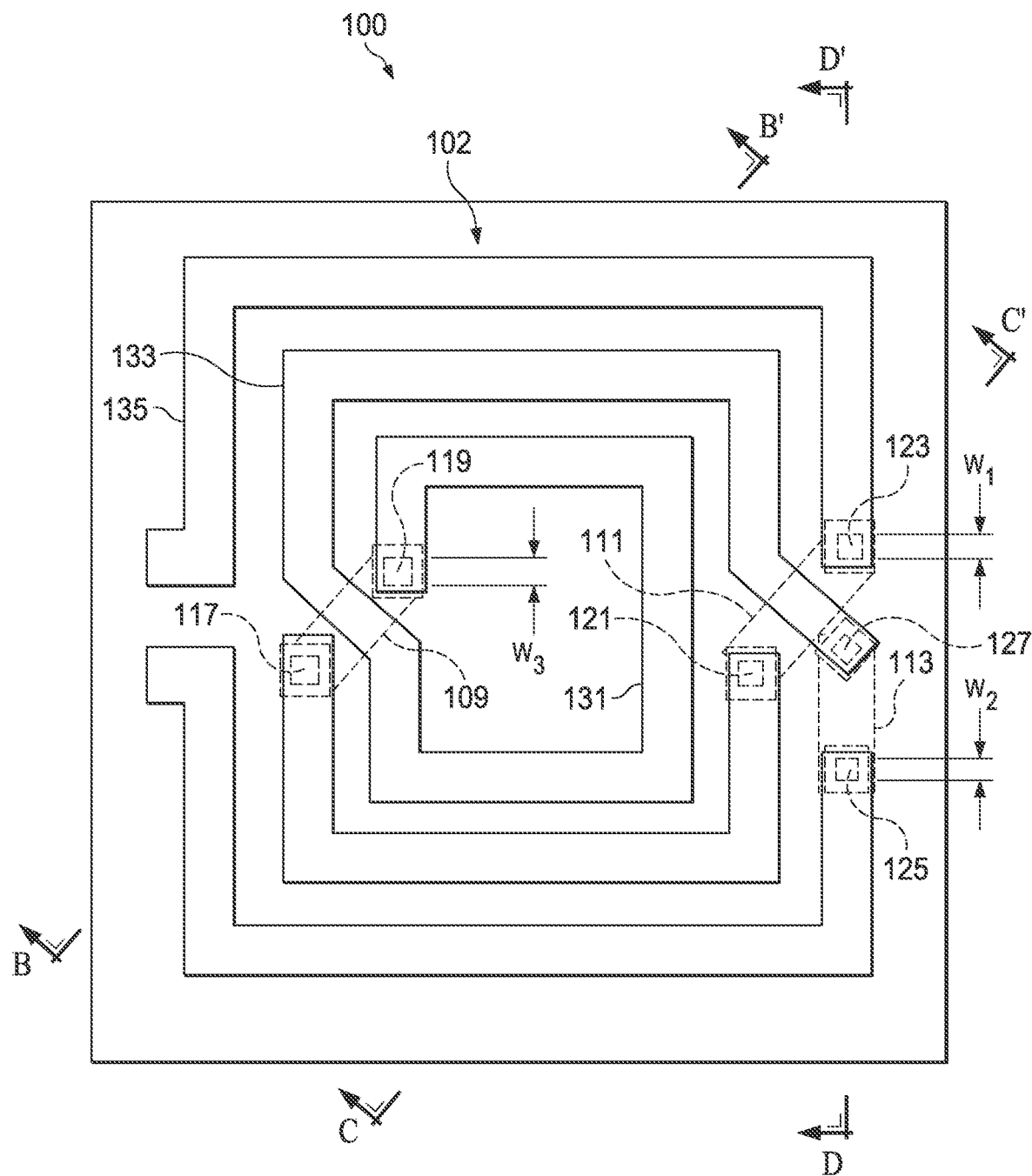
FIG. 1A-1D illustrate a programmable inductor in accordance with an embodiment.
Figure 1B:
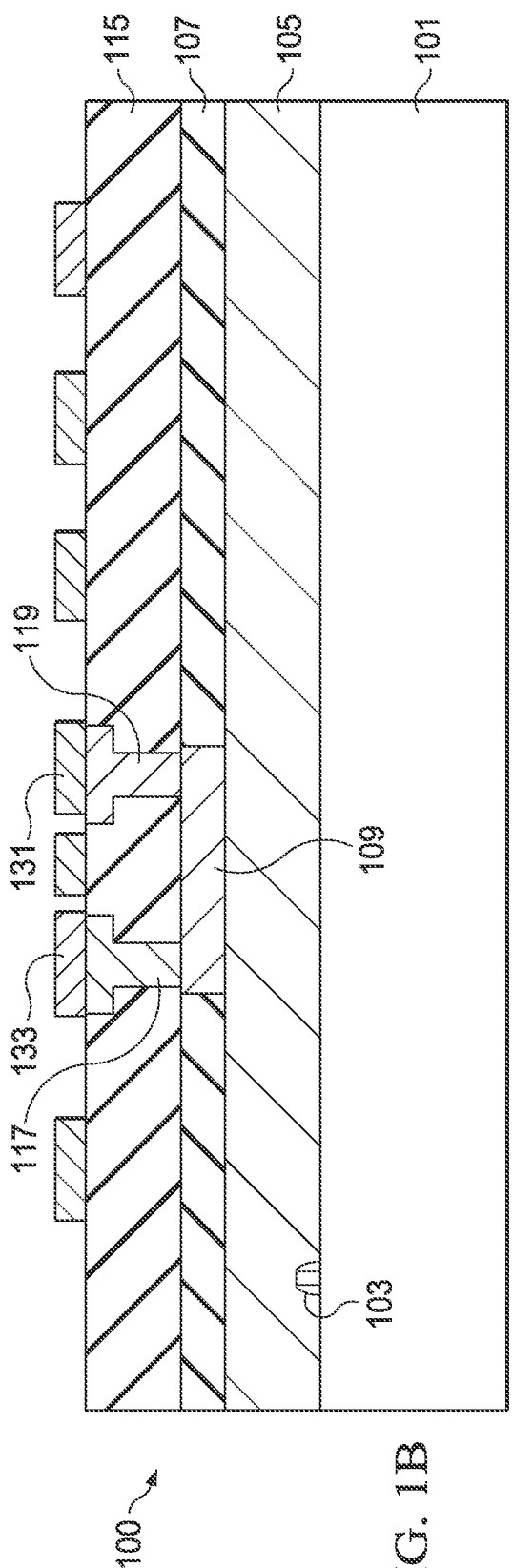
Figure 1C:
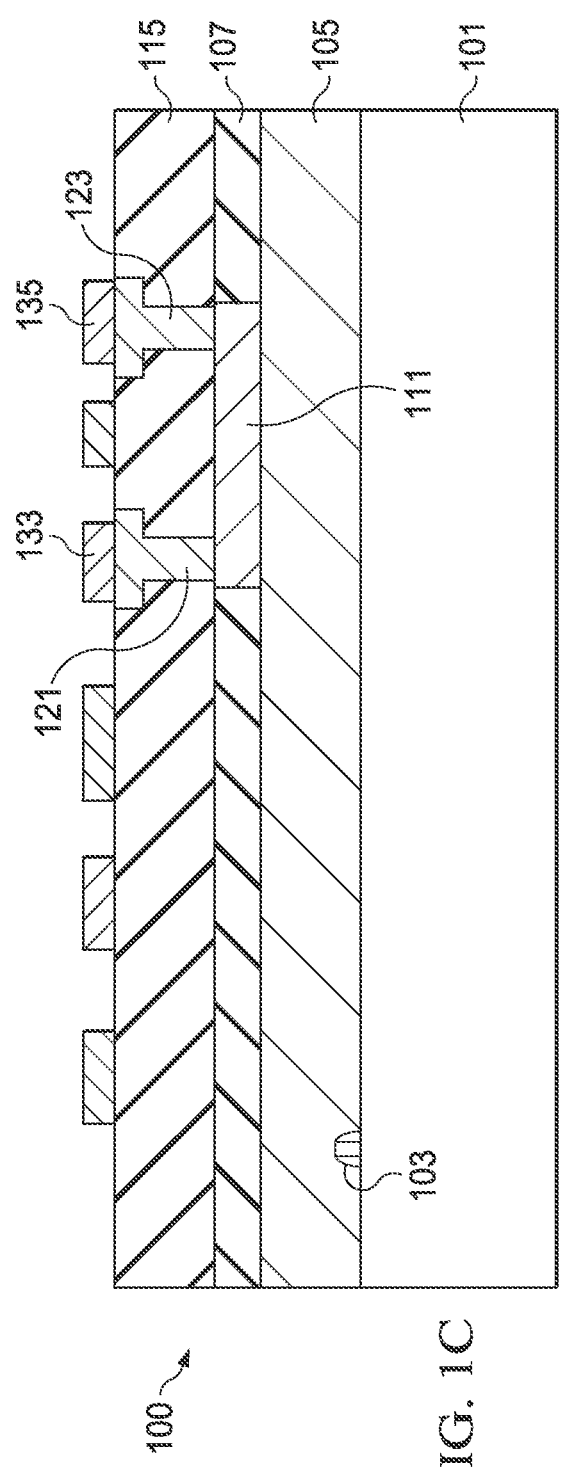
Figure 1D:
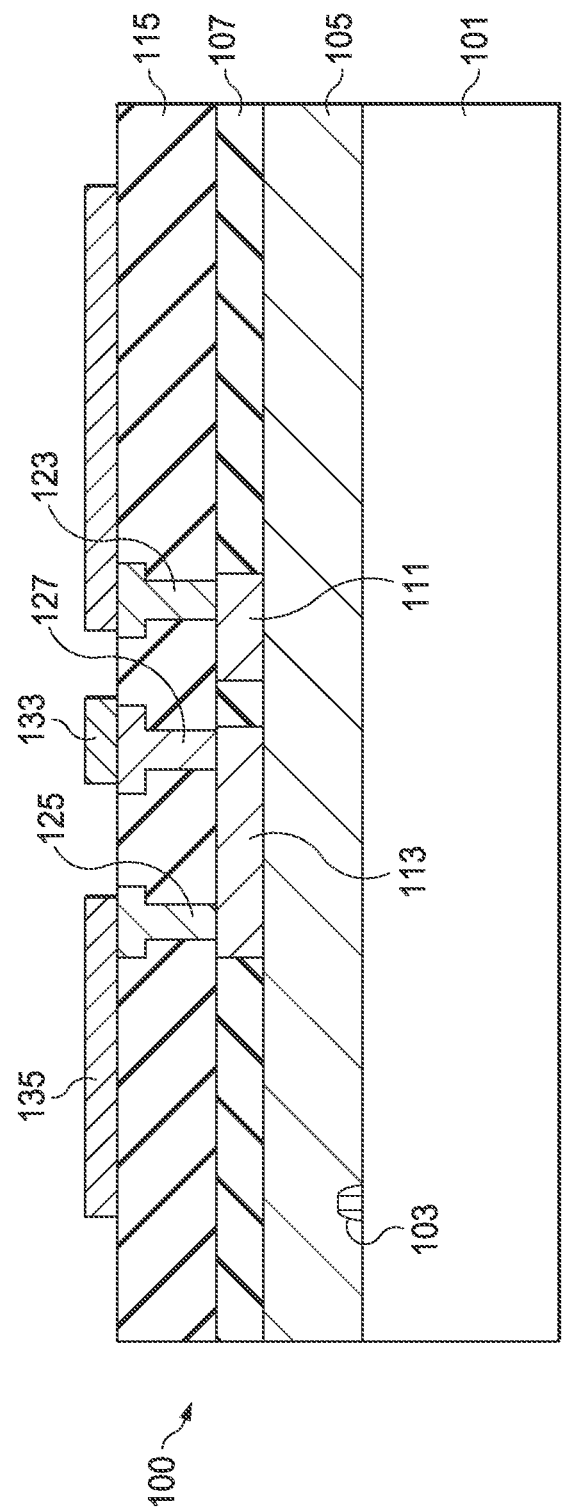

With reference now to FIGS. 1A-1D, wherein FIGS. 1B, 1C, and 1D illustrate cross sectional views of FIG. 1A along lines B-B', and C-C', and D-D', respectively, there is shown a portion of a semiconductor die 100 including a semiconductor substrate 101, active devices 103, intermediate metallization layers 105, a first interconnect 109, a second interconnect 111, a third interconnect 113, vias (including a first via 117, a second via 119, a third via 121, a fourth via 123, a fifth via 125, and a sixth via 127), a first coil 131, a second coil 133, and a third coil 135. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include active devices 103. As one of ordinary skill in the art will recognize, a wide variety of active devices and passive devices such as transistors, capacitors, resistors, combinations of these, and the like may be used to generate the desired structural and functional requirements of the design for the semiconductor die 100. The active devices 103 may be formed using any suitable methods.

The semiconductor substrate 101 may also include intermediate metallization layers 105. The intermediate metallization layers 105 may be formed over the active devices and are designed to connect the various active devices to form functional circuitry. The intermediate metallization layers 105 may be formed of alternating layers of dielectric (e.g., low-k dielectric material) and conductive material (e.g., copper) and may be formed through any suitable process (such as deposition, damascene, dual damascene, etc.).

The first interconnect 109, the second interconnect 111, and the third interconnect 113 may be formed over the intermediate metallization layers 105. The first interconnect 109, the second interconnect 111, and the third interconnect 113 may be used to interconnect the various turns or coils of the inductor 102. The first interconnect 109, the second interconnect 111, and the third interconnect 113 may comprise a conductive material such as aluminum, but other conductive materials, such as copper, may alternatively be used. The first interconnect 109, the second interconnect 111, and the third interconnect 113 may be formed using a deposition process, such as sputtering, to form a layer of material (not shown) and portions of the layer of material may then be removed through a suitable process (such as photolithographic masking and etching) to form the first interconnect 109, the second interconnect 111, and the third interconnect 113. The first interconnect 109, the second interconnect 111, and the third interconnect 113 may be formed to have a thickness of between about 4 μm and about 10 μm, such as about 7 μm.

In an embodiment the photolithographic masking and etching process utilizes a first mask (not illustrated in FIGS. 1A-1D). In an embodiment the first mask may be, e.g., a photoresist composition which may be placed on the layer of material for the first interconnect 109, the second interconnect 111, and the third interconnect 113. Once in place, the photoresist composition may be patterned into the first mask by exposing the photoresist composition to a radiation such as light in order to activate photoactive chemicals that may make up one component of the photoresist composition. A positive developer or a negative developer may then be used to remove either the exposed photoresist (for a negative development) or to remove the non-exposed photoresist (for a positive development) to form a patterned photoresist.

However, a photoresist composition is not the only material that may be used for the first mask. In alternative embodiments the first mask may be a hard mask made of a material such as silicon nitride. Such a hard mask may be formed by chemical vapor deposition and then patterned using, e.g., a photolithographic technique. Any suitable materials or processes may be utilized to form the hard mask, and all such materials and processes are fully intended to be included within the scope of the embodiments.

Once the first mask has been formed, the first interconnect 109, the second interconnect 111, and the third interconnect 113 may be constructed by removing exposed portions of the layer of material for the first interconnect 109, the second interconnect 111, and the third interconnect 113 that are left exposed by the first mask. In an embodiment the layer of material may be removed using, e.g., an etching process with the patterned photoresist acting as an etching mask. However, any suitable process may alternatively be utilized.

Once the removal of the layer of material has been completed to form the first interconnect 109, the second interconnect 111, and the third interconnect 113, the first mask may be removed. For example, in an embodiment in which the first mask is a photoresist, the first mask may be removed using an ashing process, whereby the temperature of the photoresist is increased until a thermal decomposition occurs, allowing the photoresist to be easily removed. However, any other suitable removal process, such as an etching process, may alternatively be utilized.

Additionally, while the material and methods discussed are suitable to form the conductive material, these materials are merely exemplary. Any other suitable materials, such as tungsten, and any other suitable processes of formation, such as electroplating or CVD, may alternatively be used to form the first interconnect 109, the second interconnect 111, and the third interconnect 113. Additionally, the precise placement of the first interconnect 109, the second interconnect 111, and the may also be modified, such as by forming the first interconnect 109, the second interconnect 111, and the third interconnect 113 within the substrate 101 instead of over the intermediate metallization layers 105.

The first passivation layer 107 may be initially formed over the first interconnect 109, the second interconnect 111, and the third interconnect 113. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 107 may be formed through a process such as chemical vapor deposition (CVD), although any suitable process may be utilized, and may have a thickness between about 0.5 µm and about 5 µm, such as about 9.25 KA. Once formed, the first passivation layer 107 may be planarized with the first interconnect 109, the second interconnect 111, and the third interconnect 113 using a planarization process such as, e.g., a chemical mechanical polishing process.

However, as one of ordinary skill in the art will recognize, the above described process of forming the first passivation layer 107, the first interconnect 109, the second interconnect 111, and the third interconnect 113 are merely intended to be illustrative and are not intended to limit the embodiments. Any suitable processes or order of process steps, such as forming the first interconnect 109, the second interconnect 111, and the third interconnect 113 using different methods from each other, or forming the first passivation layer 107 prior to forming the first interconnect 109, the second interconnect 111, and the third interconnect 113, may alternatively be utilized. All such methods of formation for the first interconnect 109, the second interconnect 111, and the third interconnect 113 are fully intended to be included within the embodiments.

The second passivation layer 115 may be formed over the first interconnect 109, the second interconnect 111, the third interconnect 113, and the first passivation layer 107. The second passivation layer 115 may be formed from a polymer such as polyimide. Alternatively, the second passivation layer 115 may be formed of a material similar to the material used as the first passivation layer 107, such as silicon oxides, silicon nitrides, low-k dielectrics, extremely low-k dielectrics, combinations of these, and the like. The second passivation layer 115 may be formed to have a thickness between about 2 µm and about 15 µm, such as about 5 µm.

After the second passivation layer 115 has been formed, the first via 117 and the second via 119 may be formed over the first interconnect 109 in order to allow for physical and electrical contact to the first interconnect 109 through the second passivation layer 115, the third via 121 and the fourth via 123 may be formed over the second interconnect 111 in order to allow for physical and electrical contact to the second interconnect 111 through the second passivation layer 115, and the fifth via 125 and the sixth via 127 may be formed over the third interconnect 113 in order to allow for physical and electrical contact to the third interconnect 113 through the second passivation layer 115. In an embodiment the various vias are utilized to provide interconnections between the inductor coils such as a first coil 131, a second coil 133, and a third coil 135 (illustrated in a top down view in FIG. 1A).

The first via 117, the second via 119, the third via 121, the fourth via 123, the fifth via 125, and the sixth via 127 may be formed, e.g., by first forming openings for the first via 117, the second via 119, the third via 121, the fourth via 123, the fifth via 125, and the sixth via 127 into the second passivation layer 115 using, e.g., a two step process that utilizes two suitable photolithographic masks and etching. In an embodiment the openings for the first via 117, the second via 119, the third via 121, the fourth via 123, the fifth via 125, and the sixth via 127 may be initiated using a second mask along with an etching process in order to form the shape of a lower portion of the first via 117, the second via 119, the third via 121, the fourth via 123, the fifth via 125, and the sixth via 127 (the shape that will come into contact with the first interconnect 109).

The second mask may be similar to the first mask (discussed above). For example, the second mask may be a photoresist that has been patterned by exposing and developing a layer of photoresist composition (not individually illustrated) into the desired pattern for the first via 117, the second via 119, the third via 121, the fourth via 123, the fifth via 125, and the sixth via 127. However, the second mask may alternatively be a hard mask such as silicon nitride. Any suitable masking material and any process of patterning the masking material may alternatively be utilized.

Once the second mask has been placed and patterned, the pattern of the second mask may be transferred to the second passivation layer 115. In an embodiment a directional etching process may be utilized to remove the material of the second passivation layer 115 while using the second mask as a mask during the etching. As such, only exposed and unprotected material is removed, thereby transferring the pattern of the second mask into the second passivation layer 115.

Once the pattern of the second mask has been transferred to the second passivation layer 115, the second mask may be removed. In an embodiment in which the second mask is a photoresist, the second mask may be removed using, e.g., an ashing process, whereby the temperature of the second mask is increased until a thermal decomposition occurs, whereby the photoresist may be removed. However, any other suitable method of removal, such as an etching process, may alternatively be utilized.

Once the lower portions of the first via 117, the second via 119, the third via 121, the fourth via 123, the fifth via 125, and the sixth via 127 have been shaped, the lower portions may be extended. In an embodiment, once the lower portions of the first via 117, the second via 119, the third via 121, the fourth via 123, the fifth via 125, and the sixth via 127 have been shaped by the second mask and etch, a third mask and an etching process may be used to extend the first via 117, the second via 119, the third via 121, the fourth via 123, the fifth via 125, and the sixth via 127 to the first interconnect 109 as well as widen an upper portion of the first via 117, the second via 119, the third via 121, the fourth via 123, the fifth via 125, and the sixth via 127 where the first via 117, the second via 119, the third via 121, the fourth via 123, the fifth via 125, and the sixth via 127 will come into contact with the turns of the inductor 102.

The third mask may be similar to the first mask (discussed above). For example, the third mask may be a photoresist that has been patterned by exposing and developing a layer of photoresist composition (not individually illustrated) into the desired pattern for the upper portions of the first via 117, the second via 119, the third via 121, the fourth via 123, the fifth via 125, and the sixth via 127. However, the third mask may alternatively be a hard mask such as silicon nitride. Any suitable masking material and any process of patterning the masking material may alternatively be utilized.

Once the third mask has been placed and patterned, the pattern of the third mask may be transferred to the second passivation layer 115. In an embodiment a directional etching process may be utilized to remove the material of the second passivation layer 115 while using the third mask as a mask during the etching. As such, only exposed and unprotected material is removed, thereby transferring the pattern of the third mask into the second passivation layer 115. This process forms the widened upper portions of the first via 117, the second via 119, the third via 121, the fourth via 123, the fifth via 125, and the sixth via 127, as well as extending the shape of the lower portions of the first via 117, the second via 119, the third via 121, the fourth via 123, the fifth via 125, and the sixth via 127 through the second passivation layer 115 in order to expose the first interconnect 109.

Once finished, the third mask may be removed and the openings filled to form the first via 117, the second via 119, the third via 121, the fourth via 123, the fifth via 125, and the sixth via 127. In an embodiment in which the third mask is a photoresist, the third mask may be removed using, e.g., an ashing process, whereby the material of the third mask is increased until the material of the third mask thermally decomposes and may be removed. However, any suitable removal process, such as etching or applying a suitable solvent, may alternatively be utilized.

After the third mask has been removed, the first via 117, the second via 119, the third via 121, the fourth via 123, the fifth via 125, and the sixth via 127 may be formed using a first seed layer (not shown) and a plating process, such as electrochemical plating, although other processes of formation, such as sputtering, evaporation, or PECVD process, may alternatively be used depending upon the desired materials. The first via 117, the second via 119, the third via 121, the fourth via 123, the fifth via 125, and the sixth via 127 may comprise copper, but other materials, such as aluminum or tungsten, may alternatively be used. Once the openings for the first via 117, the second via 119, the third via 121, the fourth via 123, the fifth via 125, and the sixth via 127 have been filled with conductive material, any excess conductive material outside of the openings for the first via 117, the second via 119, the third via 121, the fourth via 123, the fifth via 125, and the sixth via 127 may be removed, and first via 117, the second via 119, the third via 121, the fourth via 123, the fifth via 125, the sixth via 127, and the second passivation layer 201 may be planarized using, for example, a chemical mechanical polishing process.

By forming the first via 117 and the second via 119 in connection with the first interconnect 109, the first via 117, the second via 119, and the first interconnect 109 collectively form a first fuse. Similarly, the third via 121, the fourth via 123, and the second interconnect 111 collectively form a second fuse, and the fifth via 125, the sixth via 127, and the third interconnect 113 collectively form a third fuse. In an embodiment the first fuse, the second fuse, and the third fuse may be used to program the inductor 102.

In an embodiment the fifth via 125 and the sixth via 127 may be formed with dimensions that are smaller than the dimensions of the third via 121 and the fourth via 123. For example, in an embodiment in which the third via 121 and the fourth via 123 are formed as square vias with the lower portion having a first width $W_1$ of between about 4 μm and about 5 μm, such as about 4.5 μm, the fifth via 125 and the sixth via 127 may also be square in shape but may be formed to have a smaller width, such as having a lower portion with a second width $W_2$ of between about 1 μm and about 4 μm, such as about 2 μm. However, any suitable dimension may alternatively be utilized.

Additionally, the first via 117 and the second via 119 may be formed to have a dimension that is greater than the third via 121 and the fourth via 123 (and, hence, also greater than the fifth via 125 and the sixth via 127). For example, in an embodiment in which the third via 121 and the fourth via 123 are formed as square vias with the first width $W_1$, the first via 117 and the second via 119 may be formed to also be square and to have a lower portion with a third width $W_3$ of between about 35 μm and about 40 μm, such as about 48 μm.

By forming the fifth via 125 and the sixth via 127 with smaller dimensions than the third via 121 and the fourth via 123, and by forming the third via 121 and the fourth via 123 with smaller dimensions than the first via 117 and the second via 119, the inductor 102 can be programmed using an E-fuse process. In such a process an electrical current is passed through the inductor 102 in order to blow one or more of the first interconnect 109, the second interconnect 111, and/or the third interconnect 113. By making the fifth via 125 and the sixth via 127 with smaller dimensions than the third via 121 and the fourth via 123, and by forming the third via 121 and the fourth via 123 with smaller dimensions than the first via 117 and the second via 119, the first interconnect 109, the second interconnect 111, and the third interconnect 113 will blow in a controlled sequence, with the third interconnect 113 being blown first, followed by the second interconnect 111, and then followed by the first interconnect 109 as described further below with respect to FIGS. 2A-2B.

After the first via 117, the second via 119, the third via 121, the fourth via 123, the fifth via 125, and the sixth via 127 have been formed within the second passivation layer 115, the first coil 131, the second coil 133, and the third coil 135 of the inductor 102 may be formed over the second passivation layer 115. In an embodiment the inductor 102 may be a series of conductive coils, such as the first coil 131, the second coil 133, and the third coil 135, in a plane substantially parallel to the semiconductor substrate 101. The inductor 102 may comprise a conductive material such as copper, although other materials, such as aluminum, may alternatively be used. In an embodiment, the conductive material for the inductor 102 may be formed by first applying a seed layer (not individually illustrated) over the second passivation layer 115. A photoresist (not shown) may then be formed and patterned in order to expose the seed layer where the inductor 102 is desired to be located. The seed layer may then be utilized, for example, in an electroplating process in order to plate the conductive material over the seed layer, thereby forming the inductor 102 on the second passivation layer 115 within the patterned photoresist. Once formed, the photoresist and undesired portions of the seed layer (e.g., those portions of the seed layer that were covered by the photoresist) may be removed.

Once the first coil 131, the second coil 133, and the third coil 135 have been formed, a third passivation layer (not individually illustrated in order to better illustrate the coils) may be formed to provide protection to the first coil 131, the second coil 133, and the third coil 135. In an embodiment the third passivation layer may be similar to the second passivation layer 115, such as being a polymer such as polyimide formed to a thickness of between about 2 μm and about 15 μm, such as about 5 μm. However, any other suitable material may alternatively be utilized.

Figure 2A:
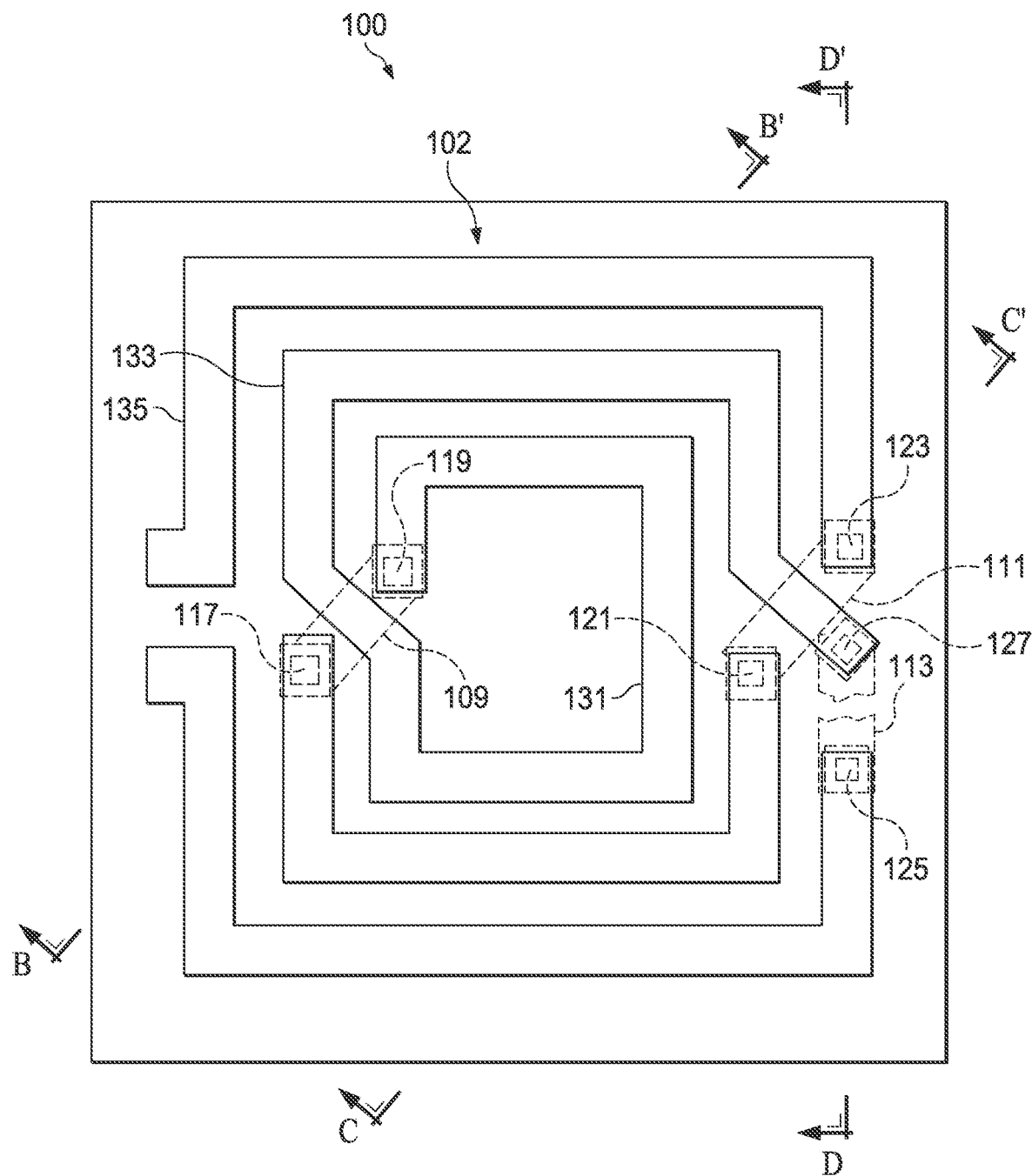
FIGS. 2A-2B illustrate a programming of the programmable inductor in accordance with an embodiment.
Figure 2B:
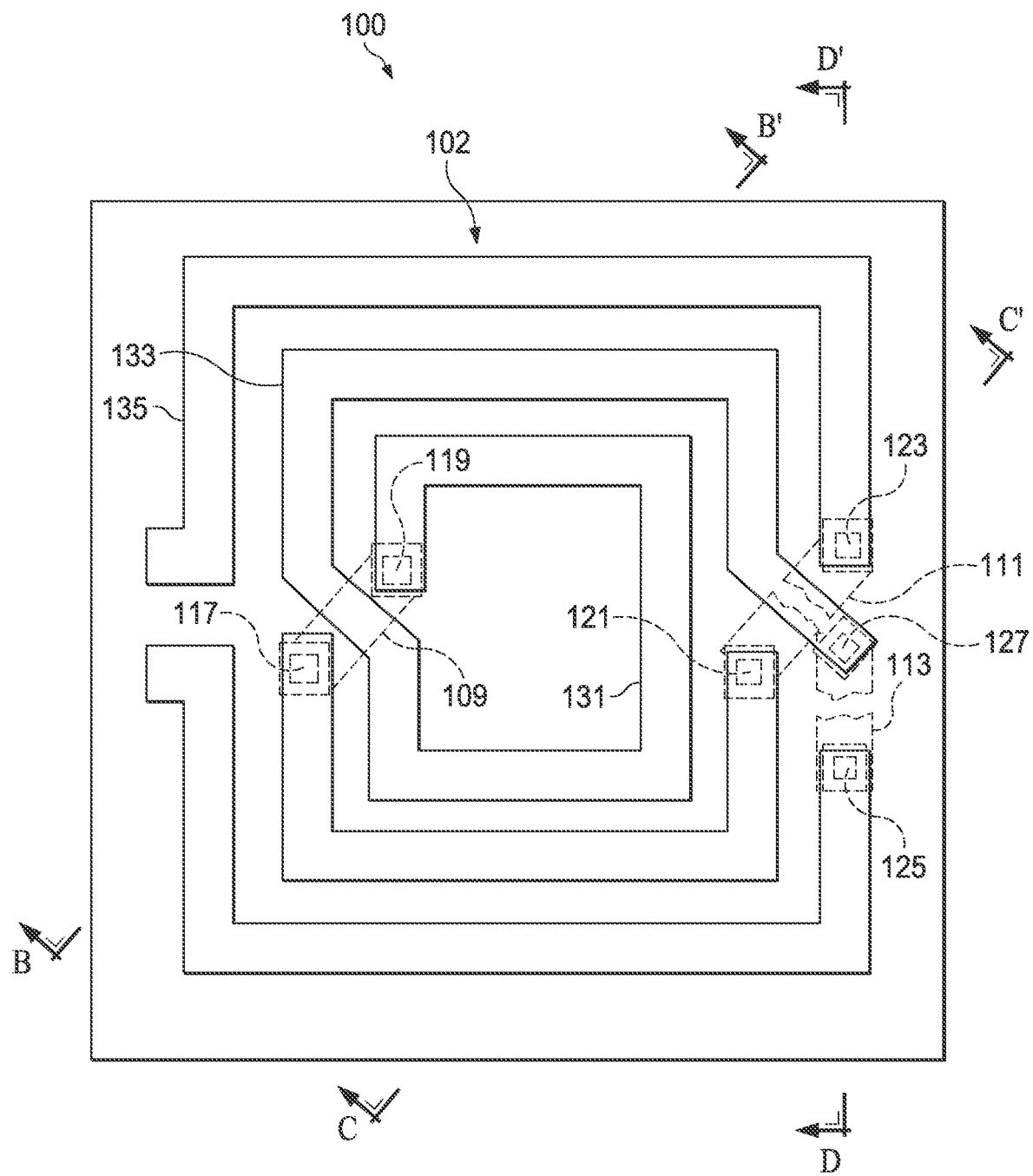

FIG. 2A-2B illustrate a process used to program the inductor 102. In the embodiment illustrated in FIG. 2A the inductor 102, while originally manufactured as having three coils (e.g., the first coil 131, the second coil 133, and the third coil 135), is programmed to have two coils (e.g., the first coil and 131 and the second coil 133) by blowing the third interconnect 113 between the second coil 133 and the third coil 135. In an embodiment the third interconnect 113 may be blown using an E-fuse process, whereby a voltage is applied to the inductor 102 of between about 1V and about 100 V, such as about 20 V, for a period of time between about 1 ns and about 10 s, such as about 2 ns. This voltage, when applied to the inductor 102 with the dimensions as described above, will blow the third interconnect 113, thereby increasing the resistance across the third interconnect 113 and operationally separating the second coil 133 from the third coil 135. As such, only the first coil 131 and the second coil 133 remain electrically connected, thereby programming the three coil structure into a two coil inductor. If desired, the E-Fuse process can be stopped after the third interconnect 113 has been blown, leaving the inductor 102 as a two turn inductor.

FIG. 2B illustrates a continuation of the programming process to turn the inductor 102 from the two turn inductor (discussed above with respect to FIG. 2A) into a one turn inductor. In this embodiment the programming is continued after the third interconnect 113 has been blown, such as for a time of between about 1 ns and about 10 s, such as about 3 ns. With the continuation of the process the next interconnect in the sequence of interconnects (e.g., the second interconnect 111) will blow in sequential order from the E-fuse process. As such, the original three coil inductor structure may be programmed to have a single remaining coil (e.g., the first coil 131).

By manufacturing a single inductor and then being able to program the inductor 102 to have a different number of turns, a single manufacturing process may be used to manufacture different types of inductors. This makes the process of manufacturing devices for different geographic regions more efficient. In particular, the particular frequencies used in one geographic region (such as a country) may be vastly different from the frequencies used in another geographic region. As such, different inductors are needed in the design of a mobile device that is intended for use in one region versus another region. For a large manufacturer of semiconductor devices that desires to make devices for all regions, the ability to manufacture a single device that is capable of being programmed for different regions, the manufacturer will be able to save time and money by not needing to redesign the inductor 102 for each region, thereby saving design costs and making the process more efficient.

Figure 3:
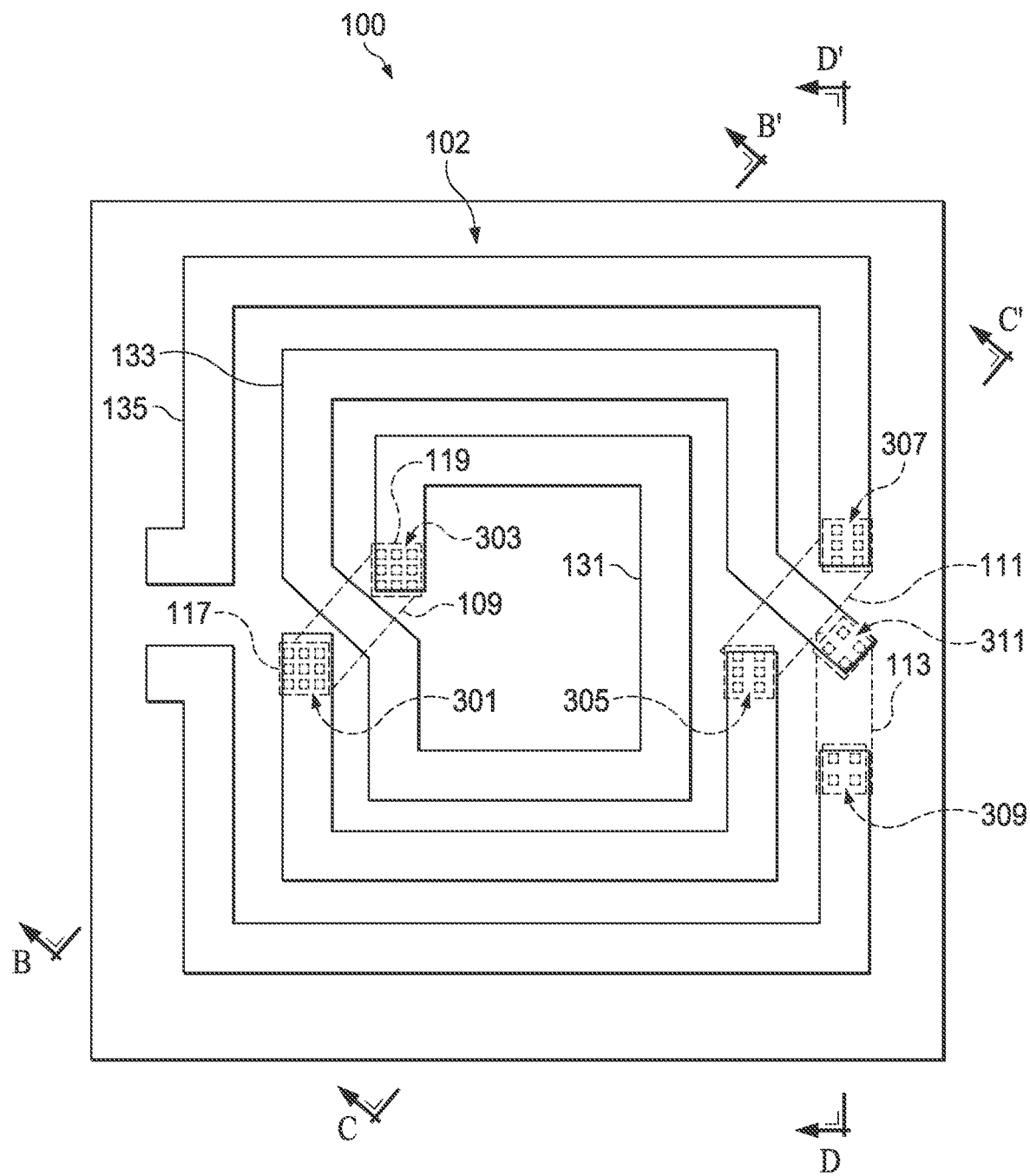
FIG. 3 illustrates a programmable inductor with groups of vias in accordance with an embodiment.

FIG. 3 illustrates another embodiment in which the first interconnect 109, the second interconnect 111, and the third interconnect 113 are blown in sequence using not the size of the vias (as described above with respect to FIGS. 1A-2B) but with a different number of vias. In this embodiment the first via 117 and the second via 119, instead of being a single via each as described and illustrated above with respect to FIGS. 1A-2B, are replaced with a first plurality of vias 301 and a second plurality of vias 303. In an embodiment the first plurality of vias 301 and the second plurality of vias 303 may each comprise a plurality of vias (represented by nine individual vias illustrated in FIG. 3) that may be between 3 vias and 100 vias, such as 9 vias. In an embodiment in which nine vias are utilized for each of the first via 117 and the second via 119, each of the nine vias may be square in shape and have a width of between about 4 μm and about 5 μm, such as about 4.5 μm.

Additionally, the third via 121 and the fourth via 123, instead of being single vias apiece, may be replaced with a third group of vias 305 and a fourth group of vias 307, respectively. In an embodiment the third group of vias 305 and the fourth group of vias 307 may comprise each comprise a smaller number of vias than the first group of vias 301 and the second group of vias 303 (represented in FIG. 3 by six vias), such as between 3 vias and 10 vias, such as 3 vias. For example, in an embodiment in which the first group of vias 301 has nine vias, the third group of vias 305 and the fourth group of vias 307 may comprise fewer than nine via, such as the six vias illustrated in FIG. 3, although any other suitable number of vias may alternatively be utilized.

Further in this embodiment the fifth via 125 and the sixth via 127, instead of being single vias apiece, may be replaced with a fifth group of vias 309 and a sixth group of vias 311, respectively. In an embodiment the fifth group of vias 309 and the sixth group of vias 311 may each comprise a smaller number of vias than the third group of vias 305 and the fourth group of vias 307. For example, in an embodiment in which the third group of vias 305 has six vias, the fifth group of vias 309 and the sixth group of vias 311 may each comprise fewer than six vias, such as the four vias apiece illustrated in FIG. 3, although any other suitable number of vias may alternatively be utilized.

By having a smaller number of vias in the fifth group of vias 309 and the sixth group of vias 311 than the third group of vias 305 and the fourth group of vias 307, and by having a smaller number of vias in the third group of vias 305 and the fourth group of vias 307 than in the first group of vias 301 and the second group of vias 303, the E-fuse process may be controlled such that the third interconnect 113 will blow before the second interconnect 111, and the second interconnect 111 will blow before the first interconnect 109. As such, the interconnects can be controlled to blow in sequence, with the third interconnect 113 blowing first, the second interconnect 111 blowing second, and the first interconnect 109 blowing last.

Once formed, the inductor 102 may be programmed as described above with respect to FIGS. 2A-2B. For example, a voltage can be applied that is sufficient to blow the first interconnect 109, the second interconnect 111, and the third interconnect 113. Because of the differences in the number of vias, the voltage will cause the third interconnect 113 to blow first, causing the originally manufactured structure of three coils to be programed to function as a two coil inductor. Additionally, if desired, the programming process may be continued to blow the second interconnect 111 as well as the third interconnect 113. As such, with both the second interconnect 111 and the third interconnect 113 blown, the structure of the three coil inductor will function as a single coil inductor.

Figure 4A:
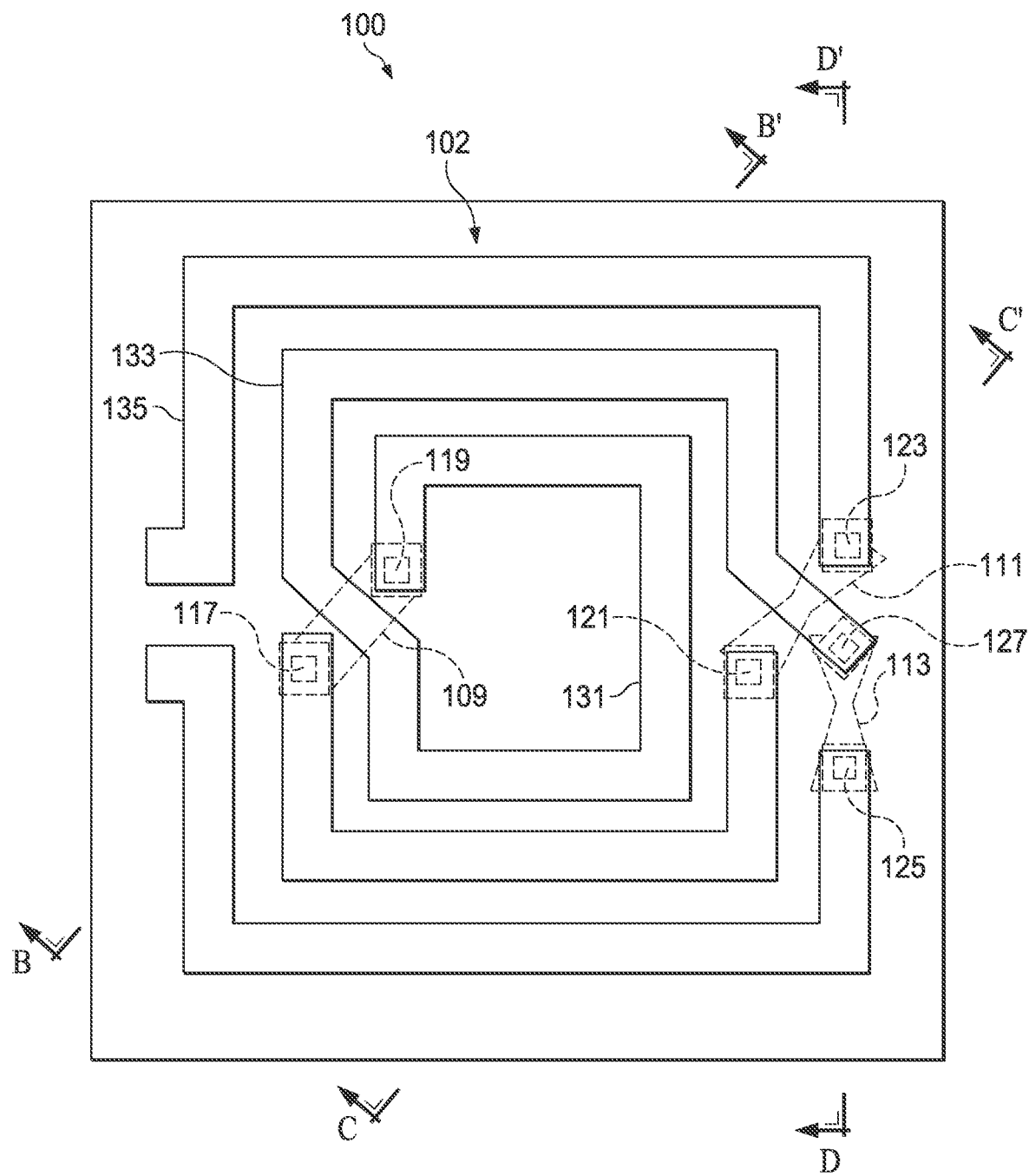
FIGS. 4A-4D illustrate a programmable inductor with differently shaped interconnects in accordance with an embodiment.
Figure 4B:
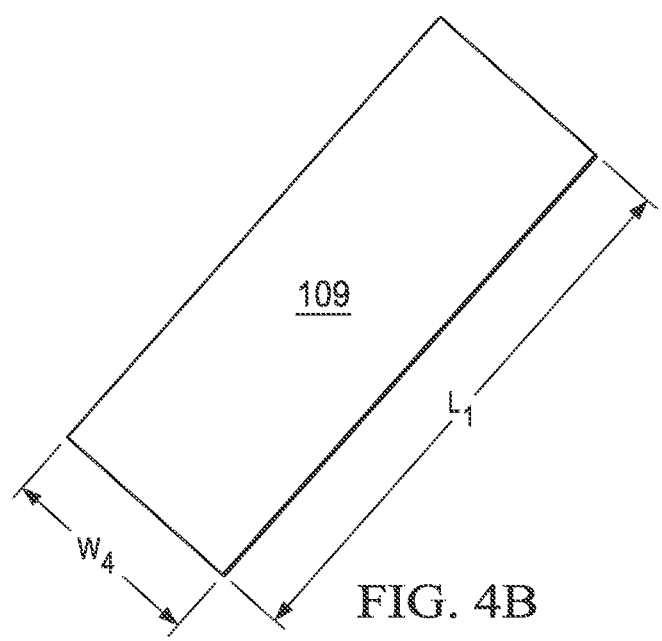
Figure 4C:
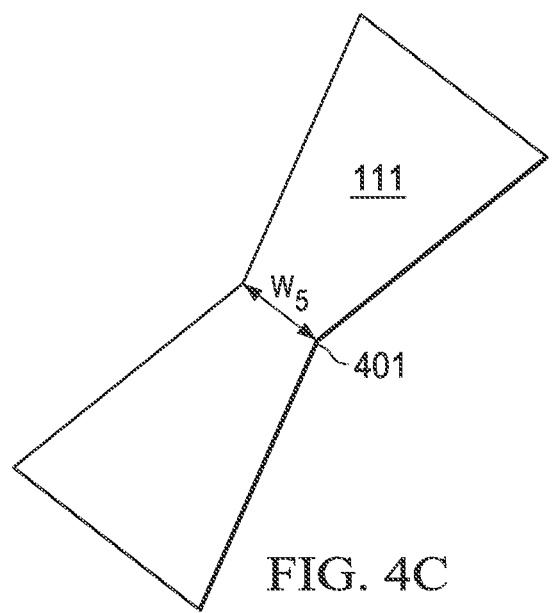

FIG. 4A illustrates another embodiment in which, rather than modifying the dimensions of the vias (as described above with respect to FIGS. 1A-1D), or modifying the number of vias (as described above with respect to FIGS. 2A-2B), the shapes of the first interconnect 109, the second interconnect 111, and the third interconnects 113 are modified in order to provide the desired programming sequence. FIG. 4A illustrates a top down view of the inductor 102, while FIG. 4B, FIG. 4C, and FIG. 4D illustrate top-down views of the first interconnect 109, the second interconnect 111, and the third interconnect 113, respectively.

In this embodiment the shape of the first interconnect 109, when looked at from a top down view as in FIG. 4A, may remain similar to the shape as in previous embodiments. More particularly, the shape of the first interconnect 109 may be, e.g., a rectangular shape with a fourth width $W_4$ between about 3 µm and about 45 µm, such as about 35 µm. Additionally, the first interconnect 109 may have a first length $L_1$ may be between about 50 µm and about 100 µm, such as about 55 µm. However, as one of ordinary skill in the art will recognize, these dimensions are intended to be illustrative only and are not intended to be limiting upon the embodiments. However, as one of ordinary skill in the art will recognize, these dimensions are intended to be illustrative only and are not intended to be limiting upon the embodiments.

However, while the first interconnect 109 may retain its rectangular shape, the second interconnect 111 may be shaped in order to have a larger resistance than the first interconnect 109. In an embodiment the second interconnect 111 may be shaped like an hourglasses with a first neck 401, as illustrated in FIG. 4C, that has a dimension that is reduced from the first interconnect 109. In an embodiment the first neck 401 of the second interconnect 111 may have dimension such as a fifth width $W_5$ of between about 1 µm and about 15 µm, such as about 10 µm.

Figure 4D:
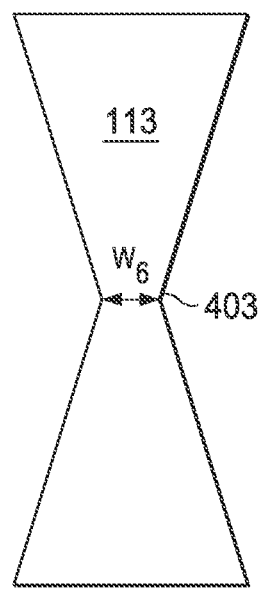

Looking next at FIG. 4D, the third interconnect 113 may have another dimension that is reduced from the second interconnect 111. For example, in an embodiment the third interconnect 113 may also be shaped like an hourglass, and may have a second neck 403 similar to the first neck 401 of the second interconnect 111. However, the second neck 403 may have a sixth width $W_6$ that is reduced from the fifth width $W_5$, such as the sixth width $W_6$ being between about 1 µm and about 15 µm, such as about 10 µm.

By shaping the third interconnect 113 to have a reduced dimension from the second interconnect 111, and by shaping the second interconnect 111 to have a reduced dimension from the first interconnect 109, the E-fuse process may be controlled such that the third interconnect 113 will blow before the second interconnect 111, and the second interconnect 111 will blow before the first interconnect 109. As such, the interconnects will blow in sequence, with the third interconnect 113 blowing first, the second interconnect 111 blowing second, and the first interconnect 109 blowing last.

Once formed, the inductor 102 may be programmed as described above with respect to FIGS. 2A-2B. In other words, a voltage is applied that is sufficient to cause the first interconnect 109, the second interconnect 111, and the third interconnect 113 to blow in sequence. Because of the differences in the shapes and dimensions, the voltage will cause the third interconnect 113 to blow first, causing the originally manufactured three coil structure to function as a two coil inductor. If desired, the E-Fuse process may be terminated at this point, thereby programming the inductor 102 as a two coil inductor.

Alternatively, if desired, the programming process may be continued to blow the second interconnect 111 as well as the third interconnect 113. As such, with both the second interconnect 111 and the third interconnect 113 blown, the originally manufactured three coil structure may be programmed to function as a single coil inductor.

However, as one of ordinary skill in the art will recognize, the shapes and dimensions described above are merely intended to be illustrative and are not intended to be limiting upon the embodiments. Rather, any suitable size and shape may alternatively be utilized in order to provide the proper programming sequence. For example, the first interconnect 109 may alternatively be shaped like an hourglass with dimensions that remain larger than the second interconnect 111. All such shapes and sizes are fully intended to be included within the scope of the embodiments.

In accordance with an embodiment, an inductor comprising a first turn of conductive material in the inductor and a second turn of conductive material in the inductor is provided. A first programmable interconnect connects the first turn to the second turn.

In accordance with another embodiment, an inductor comprising a first interconnect connected to a first turn of conductive material through a first via and connected to a second turn of conductive material through a second via, wherein the first interconnect, the first via, and the second via form a first fuse with a first resistance, is provided. A second interconnect is connected to the second turn of conductive material through a third via and is connected to a third turn of conductive material through a fourth via, wherein the second interconnect, the third via, and the fourth via form a second fuse with a second resistance greater than the first resistance. A third interconnect is connected to the third turn through a fifth via and is connected to the second turn through a sixth via, wherein the third interconnect, the fifth via, and the sixth via form a third fuse with a third resistance greater than the second resistance.

In accordance with yet another embodiment, a method of manufacturing an inductor comprising forming a first fuse over a substrate, wherein the first fuse comprises a first interconnect and a first via, and forming a second fuse over the substrate, wherein the second fuse comprises a second interconnect, a second via, and a third via, wherein the second fuse has a higher resistance than the first fuse. A first turn of conductive material is formed in connection with the first via and the second via, and a second turn of conductive material different from the first turn of conductive material is formed in connection with the third via.

Although the embodiments and their advantages have been described in detail, it should be understood that various changes, substitutions and alterations can be made herein without departing from the spirit and scope of the embodiments as defined by the appended claims. For example, the sizes and shapes of the interconnects may be changed as well as the overall size of the inductor may be changed.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of manufacturing a semiconductor device, the method comprising:
    forming a first conductive turn in physical contact with a first via and a second via; and
    forming a second conductive turn in physical contact with a third via and a fourth via, wherein the first conductive turn and the second conductive turn are individually connected to two fuses, wherein a first one of the two fuses is misaligned from a second one of the two fuses, wherein the first via is adjacent to a first plurality of vias in physical contact with the first conductive turn, wherein the second via is adjacent to a second plurality of vias in physical contact with the first conductive turn, and wherein the third via is adjacent to a third plurality of vias in physical contact with the second conductive turn.

2. The method of claim 1, wherein the fourth via is adjacent to a fourth plurality of vias in physical contact with the second conductive turn.

3. The method of claim 1, wherein a single first one of the two fuses has an hourglass shape with a first set of dimensions and a single second one of the two fuses has the hourglass shape with a second set of dimensions different from the first set of dimensions.

4. The method of claim 3, wherein the second conductive turn is connected with a third fuse, the third fuse having a rectangular shape.

5. The method of claim 1, wherein the first plurality of vias comprises between 3 vias and 100 vias.

6. The method of claim 5, wherein the second plurality of vias comprises between 3 vias and 100 vias.

7. The method of claim 6, wherein the third plurality of vias comprises a smaller number of vias than the second plurality of vias.

8. A method of manufacturing a semiconductor device, the method comprising:
    forming a first fuse connected to a first via and a second via;
    forming a second fuse connected to a third via and a fourth via; and
    forming a third fuse connected to a fifth via and a sixth via, wherein each of the first fuse, the second fuse, and the third fuse are connected to at least two of a plurality of conductive turns, wherein at least one of the first fuse, the second fuse, and the third fuse are misaligned from each other in a top down view, wherein the first fuse is connected to a first plurality of vias and a second plurality of vias, wherein the first via is one of the first plurality of vias and wherein the second via is one of the second plurality of vias, and wherein the third fuse is connected to a third plurality of vias and a fourth plurality of vias, wherein the third plurality of vias has a different number of vias than the first plurality of vias.

9. The method of claim 8, wherein the first fuse has a first shape and the second fuse has a second shape different from the first shape.

10. The method of claim 9, wherein the third fuse has the second shape but a different size from the second fuse.

11. The method of claim 10, wherein the first shape is a rectangular shape.

12. The method of claim 11, wherein the second shape is an hourglass shape.

13. The method of claim 8, wherein the first plurality of vias comprises between 3 vias and 100 vias.

14. The method of claim 13, wherein the second plurality of vias comprises between 3 vias and 100 vias.

15. The method of claim 14, wherein the third plurality of vias comprises a smaller number of vias than the second plurality of vias.

16. The method of claim 14, wherein the first plurality of vias, the second plurality of vias, and the third plurality of vias are each nine vias.

17. A method of manufacturing a semiconductor device, the method comprising:
    depositing a first conductive turn in physical contact with at least a first via and a second via, the first via connecting the first conductive turn to a first fuse and the second via connecting the first conductive turn to a second fuse; and
    depositing a second conductive turn in physical contact with at least a third via and a fourth via, the third via connecting the second conductive turn to the second fuse and the fourth via connecting the second conductive turn to a third fuse, the first fuse aligned to have a longitudinal axis which intersects a longitudinal axis of the second fuse, wherein the at least the first via is part of a first plurality of vias in contact with the first conductive turn, and wherein the at least the third via is part of a second plurality of vias in contact with the second conductive turn, the second plurality of vias having a different number of vias than the first plurality of vias.

18. The method of claim 17, wherein the first plurality of vias comprises between 3 vias and 100 vias.

19. The method of claim 18, wherein the second plurality of vias comprises between 3 vias and 10 vias.

20. The method of claim 17, wherein the first fuse has a first shape and the second fuse has a second shape different from the first shape.

* * * * *